(12) United States Patent
Oganesian et al.

(10) Patent No.: US 9,099,296 B2
(45) Date of Patent: Aug. 4, 2015

(54) STACKED MICROELECTRONIC ASSEMBLY WITH TSVS FORMED IN STAGES WITH PLURAL ACTIVE CHIPS

(71) Applicant: Tessera, Inc., San Jose, CA (US)

(72) Inventors: Vage Oganesian, Sunnyvale, CA (US); Belgacem Haba, Saratoga, CA (US); Ilyas Mohammed, Santa Clara, CA (US); Craig Mitchell, San Jose, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/060,997

(22) Filed: Oct. 23, 2013

(65) Prior Publication Data

US 2014/0048954 A1    Feb. 20, 2014

Related U.S. Application Data

(62) Division of application No. 13/051,414, filed on Mar. 18, 2011, now Pat. No. 8,587,126.

(60) Provisional application No. 61/419,037, filed on Dec. 2, 2010.

(51) Int. Cl.
    *H01L 23/48* (2006.01)
    *H01L 23/52* (2006.01)
    (Continued)

(52) U.S. Cl.
    CPC ............ *H01L 25/00* (2013.01); *H01L 23/3178* (2013.01); *H01L 23/481* (2013.01);
    (Continued)

(58) Field of Classification Search
    CPC ......... H01L 24/89; H01L 24/16; H01L 24/92; H01L 23/481; H01L 23/498
    USPC .................. 257/777, 686, 774, 786, E23.011, 257/E23.145
    See application file for complete search history.

(56) References Cited

U.S. PATENT DOCUMENTS

| 4,074,342 A | 2/1978 | Honn et al. |
| 4,682,074 A | 7/1987 | Hoeberechts et al. |

(Continued)

FOREIGN PATENT DOCUMENTS

| CN | 1490875 A | 4/2004 |
| CN | 1758430 A | 4/2006 |

(Continued)

OTHER PUBLICATIONS

Taiwanese Office Action and Search Report for Application No. 100144456 dated Jul. 29, 2014.

(Continued)

*Primary Examiner* — Nitin Parekh
(74) *Attorney, Agent, or Firm* — Lerner, David, Littenberg, Krumholz & Mentlik, LLP

(57) ABSTRACT

A microelectronic assembly is provided in which first and second electrically conductive pads exposed at front surfaces of first and second microelectronic elements, respectively, are juxtaposed, each of the microelectronic elements embodying active semiconductor devices. An electrically conductive element may extend within a first opening extending from a rear surface of the first microelectronic element towards the front surface thereof, within a second opening extending from the first opening towards the front surface of the first microelectronic element, and within a third opening extending through at least one of the first and second pads to contact the first and second pads. Interior surfaces of the first and second openings may extend in first and second directions relative to the front surface of the first microelectronic element, respectively, to define a substantial angle.

10 Claims, 9 Drawing Sheets

(51) Int. Cl.
*H01L 25/00* (2006.01)
*H01L 25/065* (2006.01)
*H01L 23/31* (2006.01)
*H01L 23/00* (2006.01)

(52) U.S. Cl.
CPC .............. *H01L 24/92* (2013.01); *H01L 24/94* (2013.01); *H01L 25/0657* (2013.01); *H01L 25/50* (2013.01); *H01L 2224/0401* (2013.01); *H01L 2224/05009* (2013.01); *H01L 2224/13025* (2013.01); *H01L 2224/16225* (2013.01); *H01L 2224/2919* (2013.01); *H01L 2224/29109* (2013.01); *H01L 2224/29111* (2013.01); *H01L 2224/29144* (2013.01); *H01L 2224/29188* (2013.01); *H01L 2224/32145* (2013.01); *H01L 2224/32245* (2013.01); *H01L 2224/73253* (2013.01); *H01L 2224/83005* (2013.01); *H01L 2224/9202* (2013.01); *H01L 2224/94* (2013.01); *H01L 2225/06513* (2013.01); *H01L 2225/06527* (2013.01); *H01L 2225/06541* (2013.01); *H01L 2924/1032* (2013.01); *H01L 2924/1037* (2013.01); *H01L 2924/10253* (2013.01); *H01L 2924/14* (2013.01); *H01L 2924/1433* (2013.01); *H01L 2924/1436* (2013.01); *H01L 2924/1437* (2013.01); *H01L 2924/15311* (2013.01)

(56) References Cited

U.S. PATENT DOCUMENTS

| | | | |
|---|---|---|---|
| 4,765,864 | A | 8/1988 | Holland et al. |
| 4,941,033 | A | 7/1990 | Kishida |
| 5,148,265 | A | 9/1992 | Khandros et al. |
| 5,148,266 | A | 9/1992 | Khandros et al. |
| 5,229,647 | A | 7/1993 | Gnadinger |
| 5,322,816 | A | 6/1994 | Pinter |
| 5,334,561 | A | 8/1994 | Matsui et al. |
| 5,347,159 | A | 9/1994 | Khandros et al. |
| 5,481,133 | A | 1/1996 | Hsu |
| 5,679,977 | A | 10/1997 | Khandros et al. |
| 5,686,762 | A | 11/1997 | Langley |
| 5,700,735 | A | 12/1997 | Shiue et al. |
| 5,703,408 | A | 12/1997 | Ming-Tsung et al. |
| 5,808,874 | A | 9/1998 | Smith |
| 5,821,608 | A | 10/1998 | DiStefano et al. |
| 5,998,861 | A | 12/1999 | Hiruta |
| 6,002,161 | A | 12/1999 | Yamazaki |
| 6,005,466 | A | 12/1999 | Pedder |
| 6,013,948 | A | 1/2000 | Akram et al. |
| 6,022,758 | A | 2/2000 | Badehi |
| 6,031,274 | A | 2/2000 | Muramatsu et al. |
| 6,037,668 | A | 3/2000 | Cave et al. |
| 6,103,552 | A | 8/2000 | Lin |
| 6,143,369 | A | 11/2000 | Sugawa et al. |
| 6,143,396 | A | 11/2000 | Saran et al. |
| 6,169,319 | B1 | 1/2001 | Malinovich et al. |
| 6,181,016 | B1 | 1/2001 | Lin et al. |
| 6,261,865 | B1 | 7/2001 | Akram |
| 6,277,669 | B1 | 8/2001 | Kung et al. |
| 6,284,563 | B1 | 9/2001 | Fjelstad |
| 6,313,024 | B1 | 11/2001 | Cave et al. |
| 6,313,540 | B1 | 11/2001 | Kida et al. |
| 6,362,529 | B1 | 3/2002 | Sumikawa et al. |
| 6,368,410 | B1 | 4/2002 | Gorczyca et al. |
| 6,399,892 | B1 | 6/2002 | Milkovich et al. |
| 6,472,247 | B1 | 10/2002 | Andoh et al. |
| 6,492,201 | B1 | 12/2002 | Haba |
| 6,498,381 | B2 | 12/2002 | Halahan et al. |
| 6,498,387 | B1 | 12/2002 | Yang |
| 6,507,113 | B1 | 1/2003 | Fillion et al. |
| 6,555,913 | B1 | 4/2003 | Sasaki et al. |
| 6,586,955 | B2 | 7/2003 | Fjelstad et al. |
| 6,608,377 | B2 | 8/2003 | Chang et al. |
| 6,638,352 | B2 | 10/2003 | Satsu et al. |
| 6,693,358 | B2 | 2/2004 | Yamada et al. |
| 6,716,737 | B2 | 4/2004 | Plas et al. |
| 6,727,576 | B2 | 4/2004 | Hedler et al. |
| 6,737,300 | B2 | 5/2004 | Ding et al. |
| 6,743,660 | B2 | 6/2004 | Lee et al. |
| 6,812,549 | B2 | 11/2004 | Umetsu et al. |
| 6,828,175 | B2 | 12/2004 | Wood et al. |
| 6,853,046 | B2 | 2/2005 | Shibayama |
| 6,864,172 | B2 | 3/2005 | Noma et al. |
| 6,867,123 | B2 | 3/2005 | Katagiri et al. |
| 6,873,054 | B2 | 3/2005 | Miyazawa et al. |
| 6,879,049 | B1 | 4/2005 | Yamamoto et al. |
| 6,914,336 | B2 * | 7/2005 | Matsuki et al. ................ 257/769 |
| 6,927,156 | B2 | 8/2005 | Mathew |
| 6,936,913 | B2 * | 8/2005 | Akerling et al. .............. 257/686 |
| 6,982,475 | B1 | 1/2006 | MacIntyre |
| 7,026,175 | B2 | 4/2006 | Li et al. |
| 7,068,139 | B2 | 6/2006 | Harris et al. |
| 7,091,062 | B2 | 8/2006 | Geyer |
| 7,112,874 | B2 | 9/2006 | Atlas |
| 7,271,033 | B2 | 9/2007 | Lin et al. |
| 7,329,563 | B2 | 2/2008 | Lo et al. |
| 7,413,929 | B2 | 8/2008 | Lee et al. |
| 7,420,257 | B2 | 9/2008 | Shibayama |
| 7,436,069 | B2 | 10/2008 | Matsui |
| 7,446,036 | B1 | 11/2008 | Bolom et al. |
| 7,456,479 | B2 | 11/2008 | Lan |
| 7,531,445 | B2 | 5/2009 | Shiv |
| 7,531,453 | B2 | 5/2009 | Kirby et al. |
| 7,719,121 | B2 | 5/2010 | Humpston et al. |
| 7,750,487 | B2 | 7/2010 | Muthukumar et al. |
| 7,754,531 | B2 | 7/2010 | Tay et al. |
| 7,767,497 | B2 | 8/2010 | Haba |
| 7,781,781 | B2 | 8/2010 | Adkisson et al. |
| 7,791,199 | B2 | 9/2010 | Grinman et al. |
| 7,807,508 | B2 | 10/2010 | Oganesian et al. |
| 7,829,976 | B2 | 11/2010 | Kirby et al. |
| 7,834,273 | B2 | 11/2010 | Takahashi et al. |
| 7,901,989 | B2 | 3/2011 | Haba et al. |
| 7,915,710 | B2 | 3/2011 | Lee et al. |
| 7,935,568 | B2 | 5/2011 | Oganesian et al. |
| 8,008,121 | B2 | 8/2011 | Choi et al. |
| 8,008,192 | B2 | 8/2011 | Sulfridge |
| 8,193,615 | B2 | 6/2012 | Haba et al. |
| 8,253,244 | B2 | 8/2012 | Kang |
| 8,263,434 | B2 | 9/2012 | Pagaila et al. |
| 8,299,608 | B2 | 10/2012 | Bartley et al. |
| 8,310,036 | B2 | 11/2012 | Haba et al. |
| 8,405,196 | B2 | 3/2013 | Haba et al. |
| 8,421,193 | B2 | 4/2013 | Huang |
| 8,421,238 | B2 | 4/2013 | Inagaki |
| 2001/0028098 | A1 | 10/2001 | Liou |
| 2001/0048591 | A1 | 12/2001 | Fjelstad et al. |
| 2002/0030245 | A1 | 3/2002 | Hanaoka et al. |
| 2002/0048668 | A1 | 4/2002 | Inoue |
| 2002/0061723 | A1 | 5/2002 | Duescher |
| 2002/0096787 | A1 | 7/2002 | Fjelstad |
| 2002/0109236 | A1 | 8/2002 | Kim et al. |
| 2002/0127839 | A1 | 9/2002 | Umetsu et al. |
| 2002/0151171 | A1 | 10/2002 | Furusawa |
| 2003/0049193 | A1 | 3/2003 | Satsu et al. |
| 2003/0059976 | A1 | 3/2003 | Nathan et al. |
| 2003/0071331 | A1 | 4/2003 | Yamaguchi et al. |
| 2003/0178714 | A1 | 9/2003 | Sakoda et al. |
| 2004/0016942 | A1 | 1/2004 | Miyazawa et al. |
| 2004/0017012 | A1 | 1/2004 | Yamada et al. |
| 2004/0043607 | A1 | 3/2004 | Farnworth et al. |
| 2004/0051173 | A1 | 3/2004 | Koh et al. |
| 2004/0061238 | A1 * | 4/2004 | Sekine .......... 257/774 |
| 2004/0104454 | A1 * | 6/2004 | Takaoka et al. ................ 257/621 |
| 2004/0121606 | A1 | 6/2004 | Raskin et al. |
| 2004/0155354 | A1 | 8/2004 | Hanaoka et al. |
| 2004/0173891 | A1 | 9/2004 | Imai et al. |
| 2004/0178495 | A1 | 9/2004 | Yean et al. |
| 2004/0188819 | A1 | 9/2004 | Farnworth et al. |
| 2004/0188822 | A1 | 9/2004 | Hara |
| 2004/0203224 | A1 | 10/2004 | Halahan et al. |
| 2004/0217483 | A1 | 11/2004 | Hedler et al. |

(56) References Cited

U.S. PATENT DOCUMENTS

| | | |
|---|---|---|
| 2004/0222508 A1 | 11/2004 | Aoyagi |
| 2004/0251525 A1 | 12/2004 | Zilber et al. |
| 2004/0259292 A1 | 12/2004 | Beyne et al. |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0099259 A1 | 5/2005 | Harris et al. |
| 2005/0106845 A1 | 5/2005 | Halahan et al. |
| 2005/0148160 A1 | 7/2005 | Farnworth et al. |
| 2005/0156330 A1 | 7/2005 | Harris |
| 2005/0181540 A1 | 8/2005 | Farnworth et al. |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0001179 A1 | 1/2006 | Fukase et al. |
| 2006/0017161 A1 | 1/2006 | Chung et al. |
| 2006/0043598 A1 | 3/2006 | Kirby et al. |
| 2006/0046348 A1 | 3/2006 | Kang |
| 2006/0046463 A1 | 3/2006 | Watkins et al. |
| 2006/0046471 A1 | 3/2006 | Kirby et al. |
| 2006/0055050 A1 | 3/2006 | Numata et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0148250 A1* | 7/2006 | Kirby .................... 438/667 |
| 2006/0154446 A1 | 7/2006 | Wood et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0278997 A1 | 12/2006 | Gibson et al. |
| 2006/0292866 A1 | 12/2006 | Borwick et al. |
| 2007/0035020 A1 | 2/2007 | Umemoto |
| 2007/0045779 A1 | 3/2007 | Hiatt |
| 2007/0052050 A1 | 3/2007 | Dierickx |
| 2007/0096295 A1 | 5/2007 | Burtzlaff et al. |
| 2007/0126085 A1 | 6/2007 | Kawano et al. |
| 2007/0194427 A1 | 8/2007 | Choi et al. |
| 2007/0231966 A1 | 10/2007 | Egawa |
| 2007/0249095 A1 | 10/2007 | Song et al. |
| 2007/0262464 A1 | 11/2007 | Watkins et al. |
| 2007/0269931 A1 | 11/2007 | Chung et al. |
| 2007/0290300 A1 | 12/2007 | Kawakami |
| 2008/0002460 A1 | 1/2008 | Tuckerman et al. |
| 2008/0020898 A1 | 1/2008 | Pyles et al. |
| 2008/0032448 A1 | 2/2008 | Simon et al. |
| 2008/0076195 A1 | 3/2008 | Shiv |
| 2008/0079779 A1 | 4/2008 | Cornell et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0111213 A1 | 5/2008 | Akram et al. |
| 2008/0116544 A1 | 5/2008 | Grinman et al. |
| 2008/0136038 A1 | 6/2008 | Savastiouk et al. |
| 2008/0150089 A1 | 6/2008 | Kwon et al. |
| 2008/0157273 A1 | 7/2008 | Giraudin et al. |
| 2008/0164574 A1 | 7/2008 | Savastiouk et al. |
| 2008/0185719 A1 | 8/2008 | Cablao et al. |
| 2008/0230923 A1 | 9/2008 | Jo et al. |
| 2008/0246136 A1 | 10/2008 | Haba et al. |
| 2008/0274589 A1 | 11/2008 | Lee et al. |
| 2008/0284041 A1 | 11/2008 | Jang et al. |
| 2009/0008747 A1 | 1/2009 | Hoshino et al. |
| 2009/0014843 A1 | 1/2009 | Kawashita et al. |
| 2009/0026566 A1 | 1/2009 | Oliver et al. |
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0045504 A1 | 2/2009 | Suh |
| 2009/0065907 A1 | 3/2009 | Haba et al. |
| 2009/0085208 A1 | 4/2009 | Uchida |
| 2009/0108464 A1 | 4/2009 | Uchiyama |
| 2009/0133254 A1 | 5/2009 | Kubota et al. |
| 2009/0134498 A1 | 5/2009 | Ikeda et al. |
| 2009/0148591 A1 | 6/2009 | Wang et al. |
| 2009/0166846 A1 | 7/2009 | Pratt et al. |
| 2009/0212381 A1 | 8/2009 | Crisp et al. |
| 2009/0224372 A1 | 9/2009 | Johnson |
| 2009/0243047 A1 | 10/2009 | Wolter et al. |
| 2009/0263214 A1 | 10/2009 | Lee et al. |
| 2009/0267183 A1 | 10/2009 | Temple et al. |
| 2009/0267194 A1 | 10/2009 | Chen |
| 2009/0283662 A1 | 11/2009 | Wu et al. |
| 2009/0294983 A1 | 12/2009 | Cobbley et al. |
| 2009/0309235 A1 | 12/2009 | Suthiwongsunthorn et al. |
| 2010/0013060 A1 | 1/2010 | Lamy et al. |
| 2010/0038778 A1 | 2/2010 | Lee et al. |
| 2010/0105169 A1 | 4/2010 | Lee et al. |
| 2010/0117242 A1 | 5/2010 | Miller et al. |
| 2010/0127346 A1 | 5/2010 | DeNatale et al. |
| 2010/0140775 A1* | 6/2010 | Jung .................... 257/686 |
| 2010/0148371 A1 | 6/2010 | Kaskoun et al. |
| 2010/0155940 A1 | 6/2010 | Kawashita et al. |
| 2010/0159643 A1 | 6/2010 | Takahashi et al. |
| 2010/0159699 A1 | 6/2010 | Takahashi |
| 2010/0164062 A1 | 7/2010 | Wang et al. |
| 2010/0167534 A1 | 7/2010 | Iwata |
| 2010/0193964 A1 | 8/2010 | Farooq et al. |
| 2010/0225006 A1 | 9/2010 | Haba et al. |
| 2010/0230795 A1 | 9/2010 | Kriman et al. |
| 2010/0258917 A1 | 10/2010 | Lin |
| 2011/0089573 A1 | 4/2011 | Kurita |
| 2011/0195546 A1* | 8/2011 | Yang .................... 438/118 |
| 2011/0204505 A1* | 8/2011 | Pagaila et al. ............ 257/686 |
| 2011/0266674 A1 | 11/2011 | Hsia et al. |
| 2012/0007232 A1 | 1/2012 | Haba |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0018895 A1 | 1/2012 | Oganesian et al. |
| 2012/0020026 A1 | 1/2012 | Oganesian et al. |
| 2012/0025365 A1 | 2/2012 | Haba |
| 2012/0068330 A1 | 3/2012 | Oganesian et al. |
| 2012/0068351 A1* | 3/2012 | Oganesian et al. ......... 257/774 |
| 2012/0068352 A1 | 3/2012 | Oganesian et al. |
| 2012/0139094 A1* | 6/2012 | Haba et al. .............. 257/690 |

FOREIGN PATENT DOCUMENTS

| | | |
|---|---|---|
| CN | 101675516 A | 3/2010 |
| CN | 201910420 U | 7/2011 |
| EP | 0316799 A1 | 5/1989 |
| EP | 0926723 A1 | 6/1999 |
| EP | 1482553 A2 | 12/2004 |
| EP | 1519410 A1 | 3/2005 |
| EP | 1551060 A1 | 7/2005 |
| EP | 1619722 A1 | 1/2006 |
| EP | 1653510 A2 | 5/2006 |
| EP | 1653521 A1 | 5/2006 |
| EP | 1686627 A1 | 8/2006 |
| JP | 60160645 A | 8/1985 |
| JP | 1106949 A | 4/1989 |
| JP | 4365558 A | 12/1992 |
| JP | 07-505982 | 6/1995 |
| JP | 08-213427 A | 8/1996 |
| JP | 11016949 A | 1/1999 |
| JP | 11195706 A | 7/1999 |
| JP | 2001085559 A | 3/2001 |
| JP | 2001-217386 A | 8/2001 |
| JP | 2002016178 A | 1/2002 |
| JP | 2002050738 A | 2/2002 |
| JP | 2002162212 A | 6/2002 |
| JP | 2002217331 A | 8/2002 |
| JP | 2002270718 A | 9/2002 |
| JP | 2002373957 A | 12/2002 |

(56) References Cited

FOREIGN PATENT DOCUMENTS

| | | |
|---|---|---|
| JP | 2003020404 A | 1/2003 |
| JP | 2003318178 A | 11/2003 |
| JP | 2004014657 A | 1/2004 |
| JP | 2004158537 | 6/2004 |
| JP | 2004165602 A | 6/2004 |
| JP | 2004200547 A | 7/2004 |
| JP | 2005026405 A | 1/2005 |
| JP | 2005031117 A | 2/2005 |
| JP | 2005093486 A | 4/2005 |
| JP | 2005101268 A | 4/2005 |
| JP | 2005209967 A | 8/2005 |
| JP | 2005216921 A | 8/2005 |
| JP | 2005294577 A | 10/2005 |
| JP | 2006080199 | 3/2006 |
| JP | 2006120931 A | 5/2006 |
| JP | 2006269968 | 10/2006 |
| JP | 2007005403 A | 1/2007 |
| JP | 2007-081304 | 3/2007 |
| JP | 2007053149 A | 3/2007 |
| JP | 2007157844 A | 6/2007 |
| JP | 2007227512 | 9/2007 |
| JP | 2007317887 A | 12/2007 |
| JP | 2008-085020 | 1/2008 |
| JP | 2008-091632 A | 4/2008 |
| JP | 2008147224 A | 6/2008 |
| JP | 2008-177249 A | 7/2008 |
| JP | 2008227335 A | 9/2008 |
| JP | 2008-258258 A | 10/2008 |
| JP | 2009016773 A | 1/2009 |
| JP | 2009111367 | 5/2009 |
| JP | 2009224699 | 10/2009 |
| JP | 2010-028601 A | 2/2010 |
| JP | 2010093228 A | 4/2010 |
| JP | 2010147281 A | 7/2010 |
| JP | 2010245506 A | 10/2010 |
| KR | 19990080037 | 12/1999 |
| KR | 20040066018 A | 7/2004 |
| KR | 10-2005-0057533 | 6/2005 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| TW | 200406884 A | 5/2004 |
| TW | 200522274 A | 7/2005 |
| TW | 200535435 A | 11/2005 |
| TW | 200933760 A | 8/2009 |
| TW | 201025501 A | 7/2010 |
| WO | 03/025998 A2 | 3/2003 |
| WO | 2004114397 | 12/2004 |
| WO | 2005022631 A1 | 3/2005 |
| WO | 2006004127 | 1/2006 |
| WO | 2008/054660 A2 | 5/2008 |
| WO | 2008108970 A2 | 9/2008 |
| WO | 2009017758 A2 | 2/2009 |
| WO | 2009023462 A1 | 2/2009 |
| WO | 2009104668 A1 | 8/2009 |
| WO | 2010104637 A1 | 9/2010 |

OTHER PUBLICATIONS

U.S. Appl. No. 11/590,616, filed Oct. 31, 2006.
U.S. Appl. No. 11/789,694, filed Apr. 25, 2007.
U.S. Appl. No. 12/143,743, "Reconstituted Wafer Level Stacking", filed Jun. 20, 2008.
David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.
International Search Report and Written Opinion for Application No. PCT/US2011/029394 dated Jun. 6, 2012.
International Search Report and Written Opinion for Application No. PCT/US2011/060553 dated Oct. 26, 2012.
International Search Report and Written Opinion for Application No. PCT/US2011/063653 dated Aug. 13, 2012.
International Search Report and Written Opinion for PCT/US2011/051552 dated Apr. 11, 2012.
International Search Report and Written Opinion for PCT/US2011/051556 dated Feb. 13, 2012.
International Search Report and Written Opinion, PCT/US2008/009356 dated Feb. 19, 2009.
International Search Report and Written Opinion, PCT/US2010/002318, dated Nov. 22, 2010.
International Search Report and Written Opinion, PCT/US2010/052458, dated Jan. 31, 2011.
International Search Report and Written Opinion, PCT/US2010/052785, Dated Dec. 20, 2010.
International Search Report and Written Opinion, PCT/US2011/063025, Mar. 19, 2012.
International Search Report Application No. PCT/US2011/029568, dated Aug. 30, 2011.
International Search Report Application No. PCT/US2011/029568, dated Oct. 21, 2011.
International Search Report, PCT/US10/52783, Dated Dec. 10, 2010.
International Search Report, PCT/US2008/002659, Oct. 17, 2008.
International Searching Authority, Search Report for Application No. PCT/US2011/060553 dated Jun. 27, 2012.
International Written Opinion for Application No. PCT/US2011/063653 dated Jan. 14, 2013.
Japanese Office Action for Application No. 2009-552696 dated Aug. 14, 2012.
Japanese Office Action for Application No. 2010-519953 dated Oct. 19, 2012.
Partial International Search Report for Application No. PCT/US2011/063653 dated Jul. 9, 2012.
Partial International Search Report, PCT/US2008/002659.
PCT/US08/09207, "Reconstituted Wafer Stack Packaging With After Applied Pad Extensions," filed Jul. 25, 2008.
Supplementary European Search Report, EP 08795005 dated Jul. 5, 2010.
Taiwan Office Action for Application No. 100113585 dated Jun. 5, 2012.
U.S. Appl. No. 12/723,039.
U.S. Appl. No. 12/784,841.
U.S. Appl. No. 12/842,612.
U.S. Appl. No. 12/842,651.
U.S. Appl. No. 12/842,717.
Office Action for Taiwan Application No. 100145366 dated Nov. 21, 2014.
Korean Office Action for Application No. 10-2010-7004471 dated May 29, 2014.
Taiwanese Office Action for Application No. 100144452 dated Oct. 17, 2014.
Chinese Office Action for Application No. 201010546210.2 dated Aug. 21, 2013.
Chinese Office Action for Application No. 201010546793.9 dated Jun. 25, 2013.
Taiwanese Office Action for Application No. 099143374 dated Jun. 24, 2013.
Extended European Search Report for Application No. EP12189442 dated Mar. 6, 2014.
Taiwan Office Action for Application No. 100144451 dated Apr. 16, 2014.
Japanese Office Action for Application No. 2009-552696 dated Nov. 1, 2013.
Preliminary Examination Report from Taiwan Application No. 099140226 dated Oct. 21, 2013.
Taiwanese Office Action for Application No. 100133520 dated Dec. 12, 2013.
Chinese Office Action for Application No. 2013100226268 dated Feb. 4, 2015.
Japanese Office Action for Application 2013-541978 dated Feb. 24, 2015.

* cited by examiner

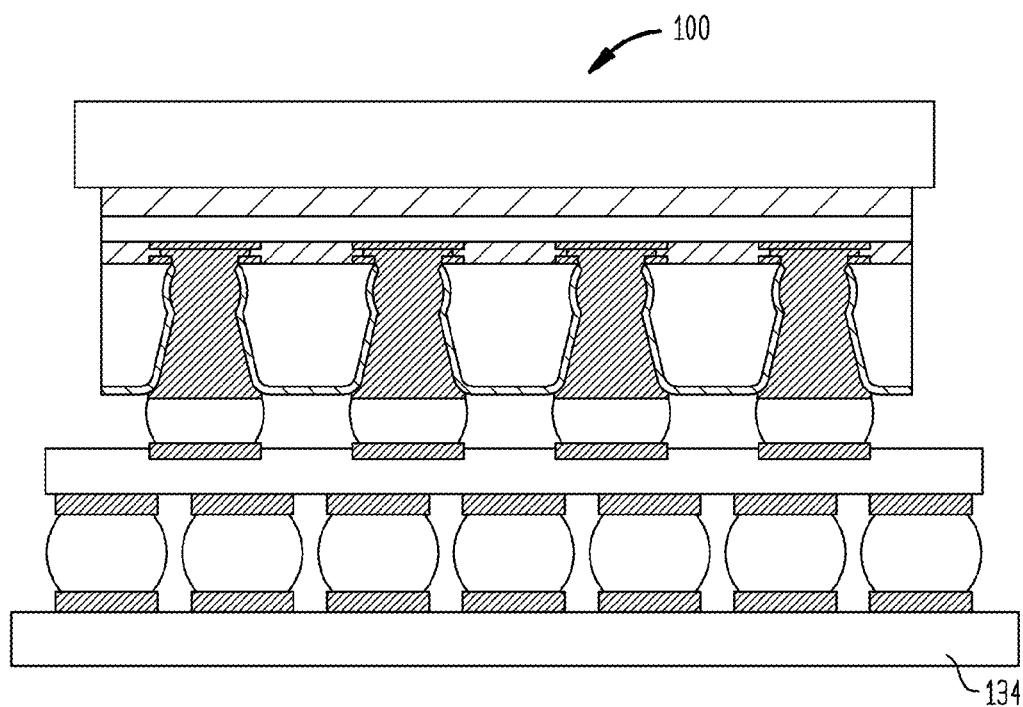
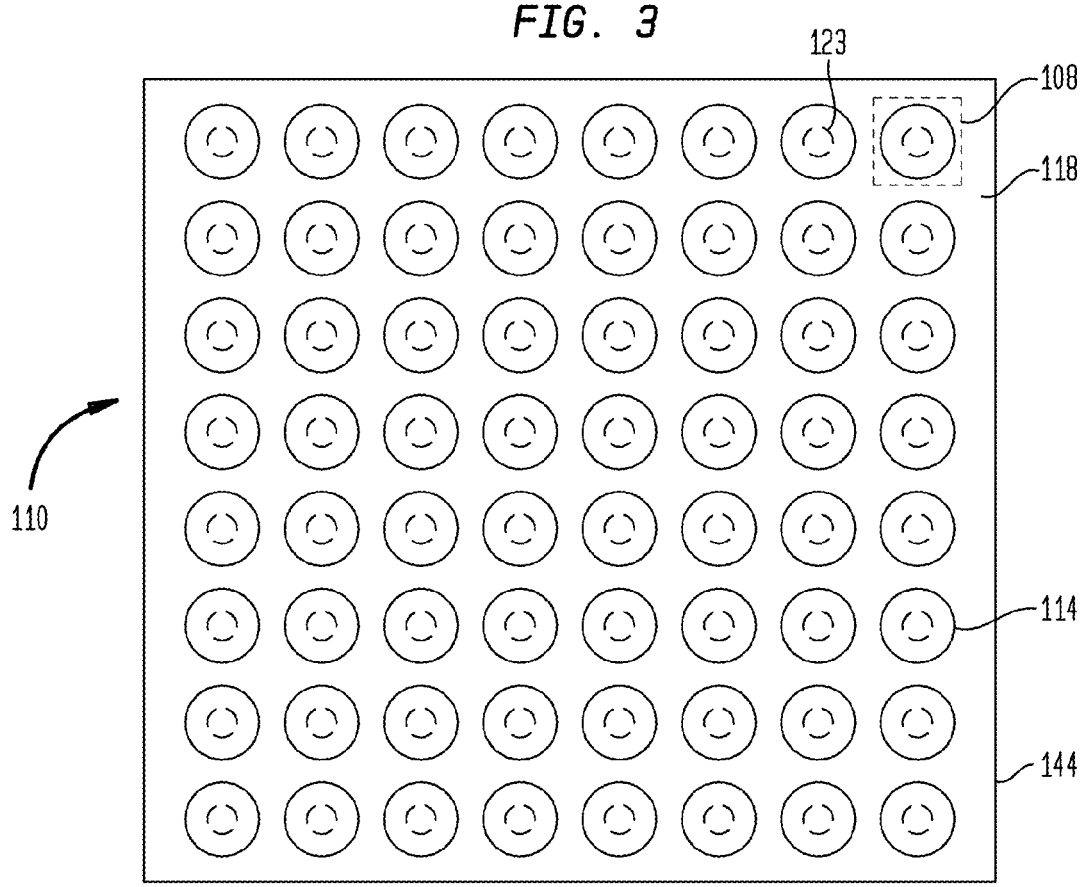

US 9,099,296 B2

STACKED MICROELECTRONIC ASSEMBLY WITH TSVS FORMED IN STAGES WITH PLURAL ACTIVE CHIPS

CROSS-REFERENCE TO RELATED APPLICATIONS

The present application is a divisional of U.S. patent application Ser. No. 13/051,414, filed Mar. 18, 2011, which claims the benefit of the filing date of U.S. Provisional Patent Application No. 61/419,037, filed Dec. 2, 2010, the disclosures of which are incorporated herein by reference.

BACKGROUND OF THE INVENTION

The present invention relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron ($\mu$m) thick. The bond pads could include a single layer or multiple layers of metal. The size of the bond pads will vary with the device type but will typically measure tens to hundreds of microns on a side.

Through-silicon vias (TSVs) can be used to provide electrical connections between the front surface of a semiconductor chip on which bond pads are disposed, and a rear surface of a semiconductor chip opposite the front surface. Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, further improvements can be made to enhance the processes for making connections between front and rear chip surfaces, and to the structures which can result from such processes.

BRIEF DESCRIPTION OF THE DRAWINGS

FIG. 2 is a sectional view illustrating a microelectronic assembly in accordance with an embodiment of the invention, as mounted to a circuit panel.

FIG. 3 is plan view further illustrating a microelectronic assembly in accordance with an embodiment of the invention.

DETAILED DESCRIPTION

Figure 1:
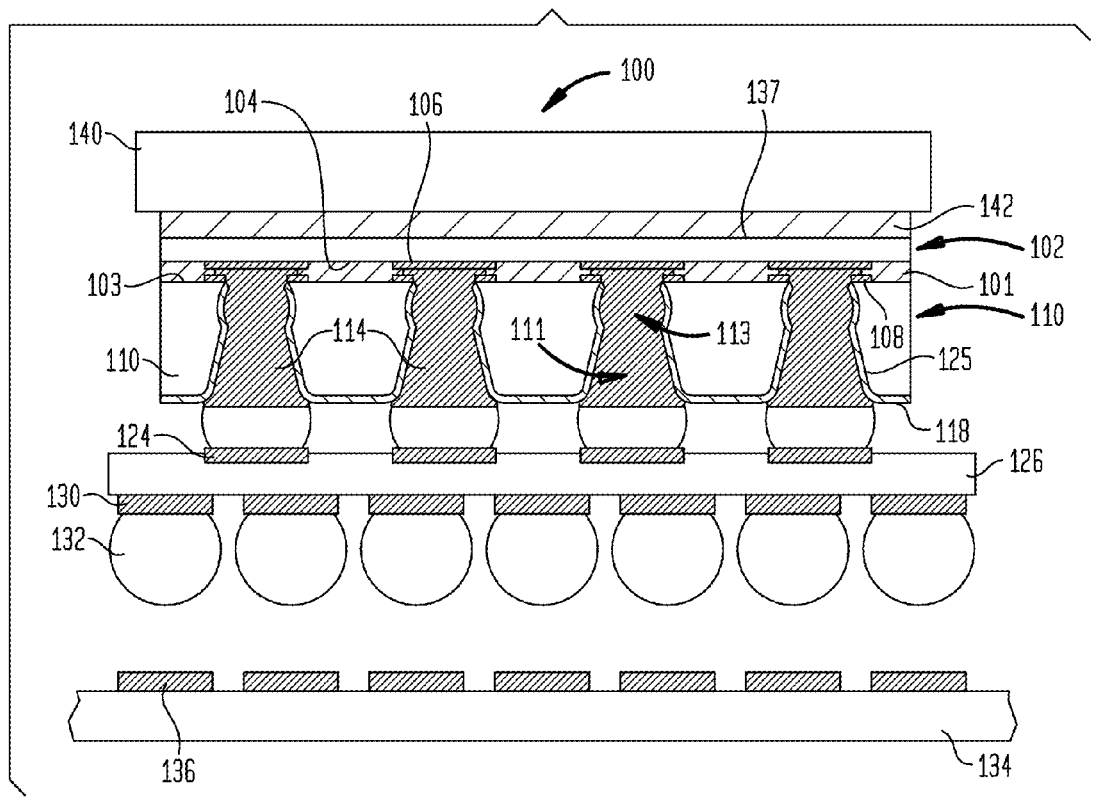
FIG. 1 is a sectional view illustrating a microelectronic assembly in accordance with an embodiment of the invention, positioned for attachment with a circuit panel.
Figure 1A:
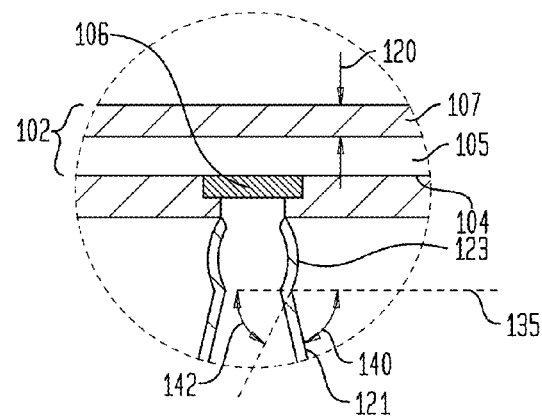
FIG. 1A is a fragmentary sectional view showing an enlarged view in greater detail of a conductive element in a microelectronic assembly in accordance with an embodiment of the invention.

FIG. 1 illustrates a microelectronic assembly 100 in accordance with an embodiment of the invention. The microelectronic package includes a microelectronic element 102, e.g., an integrated circuit embodied in a semiconductor chip, which can include silicon, an alloy of silicon, or other semiconductor material such as a III-V semiconductor material or II-VI semiconductor material. As seen in the enlarged view of FIG. 1A, the chip 102 has a front surface 104, also referred to as a contact-bearing face, being a major surface of the chip, with a first region 105 of the chip at the front face. The first region 105 typically includes a dielectric region, which typically includes a plurality of wiring layers having dielectric layers disposed between and around the wiring layers. In a particular embodiment, the dielectric region can include one or more layers of dielectric material having a low dielectric constant, i.e., a "low-k" dielectric layer. Low-k dielectric materials include porous silicon dioxide, carbon-doped silicon dioxide, polymeric dielectrics, and porous polymeric dielectrics, among others. In a porous low-k dielectric layer, the dielectric layer can have substantial porosity, which reduces the dielectric constant of the dielectric material relative to a nonporous layer of the same material. Dielectric materials typically have a dielectric constant significantly above 1.0, but air which occupies open spaces within a porous dielectric material has a dielectric constant of about 1.0. In this way, some dielectric materials can achieve reductions in the dielectric constant by having substantial porosity.

However, some low-k dielectric materials, such as polymeric dielectric materials and porous dielectric materials, withstand much less mechanical stress than traditional dielectric materials. Particular types of operating environments and ways that the microelectronic element may be tested can present stress at or near a limit that the low-k dielectric material can tolerate. The microelectronic assemblies described herein provide improved protection for the low-k dielectric layer of a microelectronic element by moving the locations where stress is applied to the microelectronic element away from the low-k dielectric layer within region 105. In this way, manufacturing, operation and testing apply much reduced stresses to the low-k dielectric layer, thus protecting the low-k dielectric layer.

Layer 105 also includes active semiconductor devices (e.g., transistors, diodes, or other active devices), which are ultimately connected by the wiring layers with a plurality of electrically conductive pads 106 at the front face. When the chip is a silicon-on-insulator ("SOI") type chip, the first region 105 may also include a buried dielectric layer which underlies the active semiconductor devices. The first region 105 may separate a second region 107 of the chip from the front face 104. The first region typically has a thickness of 0.1 micron to 5 microns, and typically cannot be thinned. The second region 107 typically consists essentially of semiconductor material (typically either monocrystalline or polycrystalline) and typically has a thickness under 20 microns, the thickness typically being determined by the degree to which an initial semiconductor wafer has been thinned during processing. In one embodiment, the chip may have only the first region 105 and the second region 107 may not be present.

As further seen in FIG. 1, another microelectronic element 110, a semiconductor chip embodying active semiconductor devices, is mounted with the microelectronic element 102 such that front surfaces 103, 104 of the microelectronic elements face one another. As shown in FIG. 1, a plurality of electrically conductive pads 108 of microelectronic element 110 can be juxtaposed with the conductive pads 106 of microelectronic element 102. The microelectronic elements typically are bonded together, such as with an adhesive 101. Other possible bonding materials can include glass, which in a particular embodiment, can be doped and can have a glass transition temperature below 500° C. Typically, microelectronic element 110 consists essentially of the same semiconductor material as the other microelectronic element 102. As further seen in FIG. 1, microelectronic element 110 can have a plurality of conductive via elements extending through openings in the microelectronic element for providing electrically conductive connections with the conductive pads 108, and 106.

The vias can be "staged vias" having multiple stages between a rear surface of one of the microelectronic elements and at least one conductive pad thereof, or alternatively, can be single stage vias, In one example, microelectronic element 110 can have a plurality of first openings 111 which extend from an exposed outwardly-facing surface 118 towards the chip front surface 104. A plurality of second openings 113 can extend from respective first openings 111 to respective conductive pads 106 of the chip. As further seen in FIG. 1A, at locations where the first and second openings meet, interior surfaces 121, 123 of the first and second openings extend at different angles 140, 142 relative to a plane defined by the major surface 104, which is the same as the angles 140, 142 relative to any plane 135 parallel to the major surface. Thus, the interior surfaces of the first and second openings extend in first and second directions, respectively, to define a substantial angle.

A plurality of conductive elements 114 extend within the first and second openings and are electrically coupled to the conductive pads 106, 108. The conductive elements 114 typically are insulated from other portions of chip 110 by an insulating layer 125 which can line interior surfaces 121, 123 of the first and second openings. The conductive elements 114 typically are exposed at an exposed outwardly-facing surface 118 of microelectronic element 110. In one example, the conductive elements 114 can include metal features which are formed by depositing a metal in contact with exposed surfaces of the conductive pads 106, 108. Various metal deposition steps can be used to form the conductive elements, as described in further detail below.

As further seen in FIG. 1, the conductive elements 114 can be conductively bonded, similar to a flip-chip manner, to contacts 124 exposed at a surface of a dielectric element 126, such as through masses 128 of a bond metal, e.g., solder, tin, indium, or a combination thereof. In turn, the dielectric element can have a plurality of terminals 130 for further electrically connecting the package 100 to corresponding contacts 136 of a circuit panel 134, such as through conductive masses 132, e.g., solder balls, projecting away from the dielectric element 126. FIG. 1 illustrates the package 100 prior to joining the circuit panel 134 thereto. FIG. 2 illustrates a microelectronic assembly which includes the package 100 and the circuit panel 134 joined thereto.

A heat spreader 140 may be thermally coupled to a rear surface 137 of microelectronic element 102, such as through a thermally conductive material 142, e.g., a thermally conductive grease, thermally conductive adhesive, or a joining metal having a relatively low melting temperature such as solder, tin, indium, gold, or other material. When the thermally conductive material 142 is also electrically conductive, such as a metal or conductive compound of a metal, a dielectric layer (not shown) can separate the rear surface 137 of the microelectronic element 102 from such thermally and electrically conductive material 142.

FIG. 3 is a view looking toward the rear surface 118 of the microelectronic element 110 of the package illustrating conductive elements 114 exposed at the rear surface, which are shown arranged in an area array. As also shown in FIG. 3, the conductive elements 114 extend within second openings 123 and are connected to conductive pads 108 exposed at the front surface 103 (FIG. 1) of microelectronic element 110, which can also be arranged in an area array. Alternatively, when the conductive pads 108 of microelectronic element have a different arrangement, such as can be arranged adjacent peripheral edges 114, or can be arranged centrally to the front surface, the conductive elements 114 typically have a matching pattern.

Figure 4:
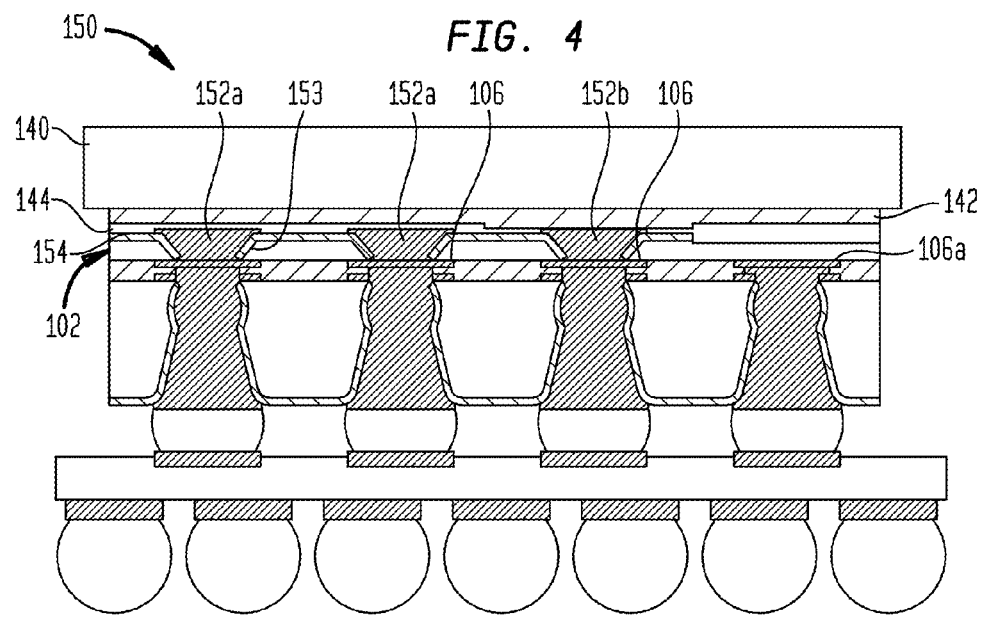
FIG. 4 is a sectional view illustrating a microelectronic assembly in accordance with a variation of the embodiment of the invention shown in FIG. 1.

FIG. 4 illustrates a microelectronic package 150 according to another embodiment of the invention. As seen in FIG. 4, microelectronic element 102 may further include conductive elements 152 extending within openings 153 extending from a rear surface 154 of microelectronic element 102, the conductive elements 152 contacting the conductive pads 106. As further shown in FIG. 4, some conductive pads 106a may not be in contact with a conductive element 152 extending within an opening 153 in the microelectronic element. One or more conductive elements 152b may be electrically connected with a metallic heat spreader 140 or ground plane through an electrically and thermally conductive material 142 between them. However, other conductive elements 152a can be electrically isolated from such heat spreader or ground plane by a dielectric layer 144.

Figure 5:
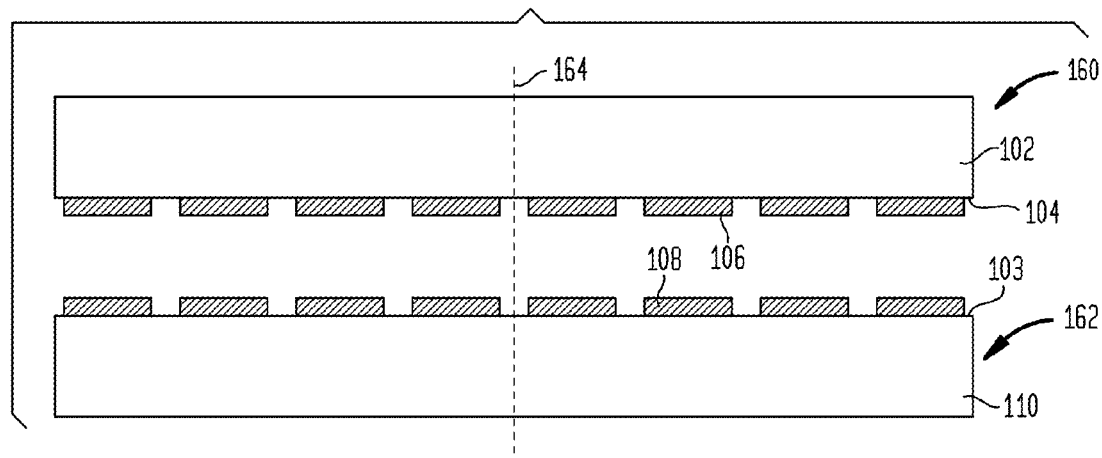
FIGS. 5 and 6 are sectional views illustrating stages in a method of fabricating a microelectronic assembly according to an embodiment of the invention.
Figure 6:
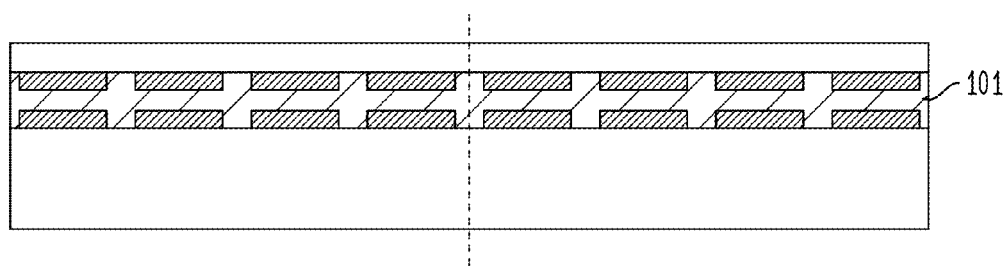

Referring to FIG. 5, a method of making a microelectronic package will now be described. As illustrated therein, a semiconductor wafer 160 or a portion of a wafer having a plurality of microelectronic elements 102 attached together as dicing lanes 164, is arranged such that a front surface 104 thereof faces a front surface 103 of another wafer 162 having a plurality of microelectronic elements 110 attached together at the dicing lanes 164. The wafers 160, 162 can be aligned such that multiple pairs of, or even all conductive pads 106, 108 of each wafer are juxtaposed with one another. Thereafter, as shown in FIG. 6, the wafers 160, 162 are bonded together, such as by an adhesive 101. Then, a thickness of wafer 160 can be reduced, such as by grinding, lapping, or polishing.

Figure 7:
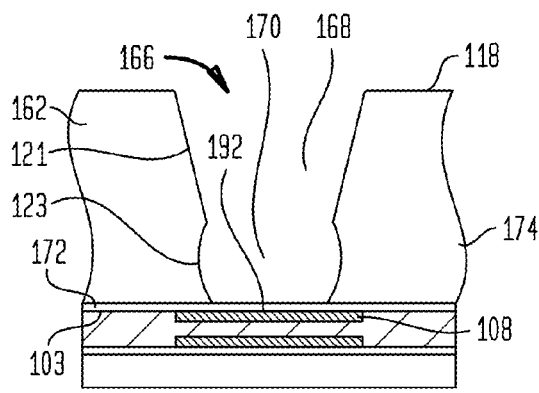
FIGS. 7, 8, 9, and 10 are fragmentary sectional views illustrating stages subsequent to the stage shown in FIG. 6, in a method of fabricating a microelectronic assembly according to an embodiment of the invention.

FIG. 7 is a fragmentary view illustrating a further step in processing in which staged openings 166 are created in the wafer 162 which includes microelectronic elements 110. FIG. 7 shows a stage of processing after the staged opening 166 has been defined. Specifically, a staged opening 166 includes a first opening 168 extending from a rear surface 118 of microelectronic element 110 towards a front surface 103 thereof. A second opening 170 extends from the first opening towards the front surface. The microelectronic element will include many such staged openings 166, within each of which a conductive element 114 can be formed. In one example, the staged opening can be formed by a series of steps, which can include etching, laser patterning, mechanically milling, micro-particle abrasion, e.g., from a directed stream of particles, typically referred to as "sandblasting", or a combination or series of such steps. The interior surfaces 121, 123 of the openings can have the arrangement as described above relative to FIG. 1A. The process of forming the first and second openings can be as generally described in any or all of United States Patent Publication No. 20080246136A1, or United States applications, each filed Jul. 23, 2010: application Ser. Nos. 12/842,717, 12/842,612, 12/842,669; 12/842, 692; 12/842,587, the disclosures of which are incorporated herein by reference.

Figure 8:
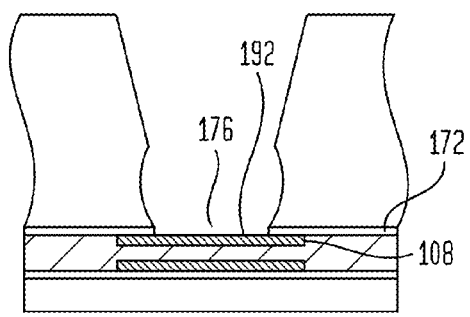

The process of forming the staged opening can be performed selectively with respect to a dielectric region 172 of the wafer 162 disposed between a semiconductor region 174 and the pad 108 such that the opening does not go through the dielectric layer 174. The dielectric region 172 can include a passivation layer, one or more dielectric layers in which wiring layers of the wafer can be disposed, or both the passivation layer and such dielectric layer. For ease of reference, any or all of these can be referred to hereinafter alternatively as the "passivation layer" 172. Thereafter, as seen in FIG. 8, an opening 176 can be formed which extends through the passivation layer 172.

Figure 9:
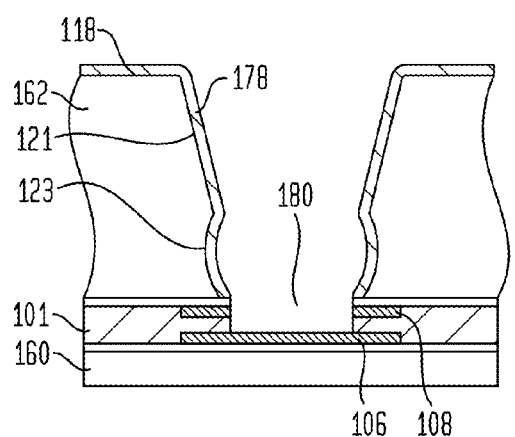

Before or after forming the opening 176 in the passivation layer 172, a dielectric layer 178 (FIG. 9) can be formed which extends along the interior surfaces 121, 123 of the staged opening and which contacts the rear surface 118 of the wafer. In one example, an electrophoretic deposition technique can be used to form a dielectric coating 178 conformally with respect to the interior surfaces 121, 123 of the openings and the surface 118. In this way, the conformal dielectric coating may be deposited only onto exposed conductive and semi-conductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 178 on exposed surfaces of the device wafer which are conductive or semiconductive. Electrophoretic deposition can occur so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition typically forms a continuous and uniformly thick conformal coating on conductive and/or semiconductive exterior surfaces of the assembly. In addition, the electrophoretic coating can be deposited so that it does not form on the remaining dielectric layer 172 overlying the bottom surface 192 of the conductive pad 108, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. In a particular example, the conformal dielectric layer 178 can be formed from a cathodic epoxy deposition precursor. Alternatively, a polyurethane or acrylic deposition precursor could be used.

In further processing, an opening 180 can be formed in the pad 108, such as by etching through the conductive pad 108 in a manner performed selectively to the dielectric bonding material 101, e.g., adhesive, after which the bonding material exposed within such opening 180 can be removed to expose the underlying conductive pad 106 of wafer 160.

Figure 10:
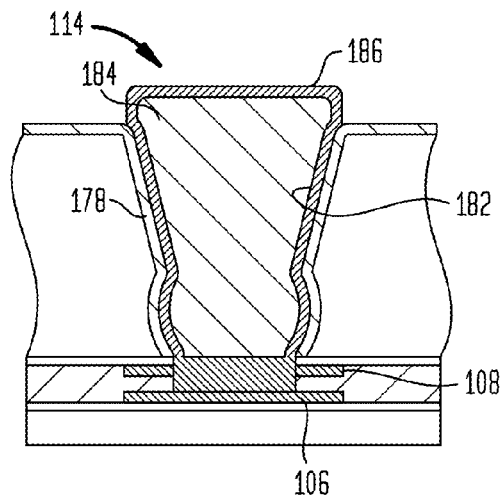

Thereafter, as seen in FIG. 10, one or more layers 182 of conductive material, e.g., a metal, can be deposited onto the exposed portion of pad 106 and in contact with pad 108 and dielectric layer 178. The metal can be deposited by various ways, such as sputtering, physical or chemical vapor deposition, which may or may not be plasma assisted, atomic layer deposition, plating, a combination thereof, or other method. A dielectric layer 184 may be deposited onto the metal layer 182, and a pad metal layer 186 may then be deposited or otherwise formed on one or more exposed surfaces the dielectric layer to form the conductive element 114 shown in FIG. 10.

Figure 11:
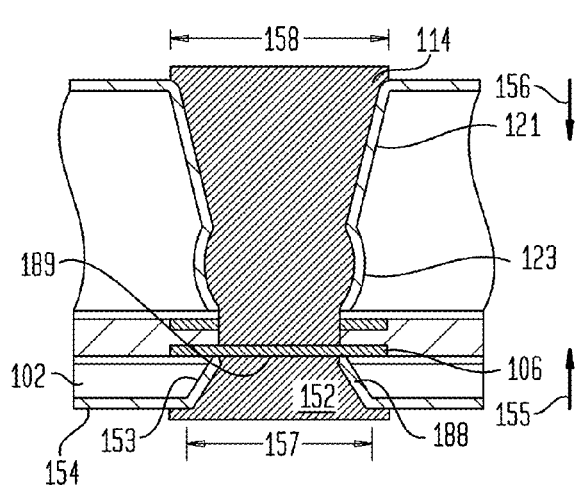
FIG. 11 is a fragmentary sectional view illustrating a stage of fabricating a microelectronic assembly according to an embodiment of the invention which can occur after or before the stages of fabrication illustrated in FIGS. 7, 8, 9 and 10.

Thereafter, referring to FIG. 11, further processing can be performed to form an opening 153 extending from the rear surface 154 of the microelectronic element 102 to expose a lower surface 189 of the pad 106 which faces toward the rear surface 154 of the microelectronic element 102. Such opening 153 then is lined with a dielectric layer 188 (FIG. 11), and then the conductive element 152 is formed therein, such as by depositing one or more metal layers on the dielectric layer 188, as described above. As seen in FIG. 11, one or more of the openings in the microelectronic elements can be tapered. For example, the openings 153 and 121 can be tapered such that widths 157, 158 of these openings, respectively, become smaller in opposite directions 155, 156. The same may also be true of openings 153 and 123 being tapered in opposite directions 155, 156.

FIG. 11 illustrates an example in which the conductive elements 114, 152 substantially fill the spaces within the respective openings and are non-hollow in that they do not contain interior cavities of non-metal material. However, as seen in FIG. 10, and further in FIG. 12, the conductive elements 114b, 152c can be hollow.

Figure 12:
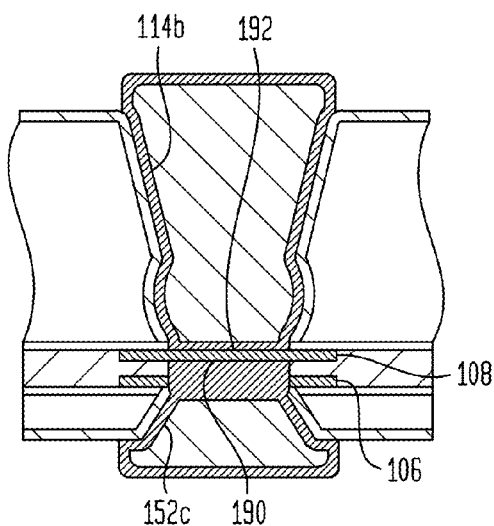
FIG. 12 is a fragmentary sectional view illustrating a microelectronic assembly according to a variation of the embodiment illustrated in FIG. 11.

FIG. 12 further illustrates a particular example in which the conductive element 152c extending through the microelectronic element 102 extends through the conductive pad 106 to contact an upper surface 190 of pad 108 which faces pad 106. The structure in FIG. 12 can be made by a variation of the above-described process in which the conductive element 114b is formed on the lower surface 192 of the pad 108 following the staged shown in FIG. 8, and in which an opening is formed in the pad 106 which extends to the upper surface of pad 108, in a similar manner to the processing described above (FIGS. 9-10) for forming an opening in pad 108.

Figure 13:
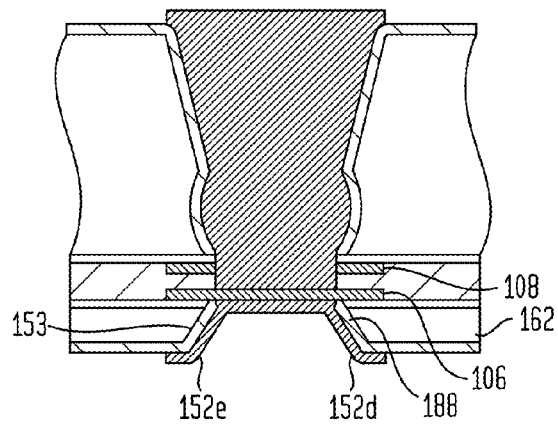
FIG. 13 is a fragmentary sectional view illustrating a microelectronic assembly according to another variation of the embodiment illustrated in FIG. 11.

As further seen in FIG. 13, it is not necessary that the conductive elements in wafer 162 be non-hollow. For example, a conductive element can have one or more portions 152d, 152e extending along the dielectric layer 188 lining the opening 153. In one example, portions 152d, 152e can be portions of a continuous layer which fully covers an interior surface of the opening 153. In another example, the portions 152d, 152e, can represent distinct features which may not be connected together along the interior surface 153, but which may be connected to a surface of one or more of the pads 106, 108.

Figure 14:
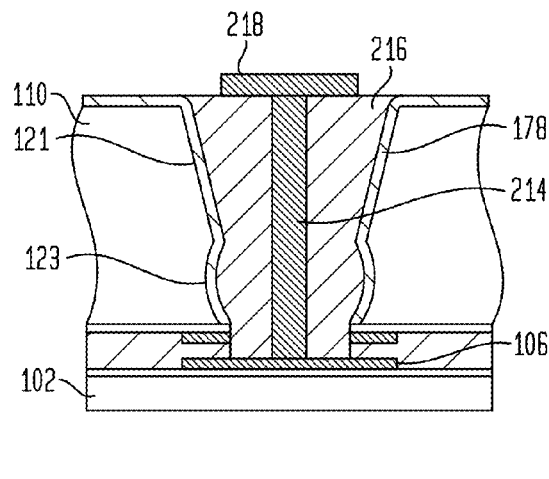
FIG. 14 is a fragmentary sectional view illustrating a microelectronic assembly according to another variation of the embodiment illustrated in FIG. 11.

In each of the embodiments illustrated in FIGS. 1,2,4, and 10-13, the conductive elements conform to contours of the interior surfaces 121, 123, and 153 of the openings in the microelectronic elements 102, 110. However, in another embodiment, a conductive element need not conform to the contours of interior surfaces of the openings. For example, FIG. 14 shows an embodiment in which a conductive element 214 does not conform to the contours of either of the interior surfaces 123, 121 of the openings in microelectronic element 110. Such conductive element may be formed, for example, by forming a dielectric region 216 which fills the space within the openings, then forming an aperture which extends through the dielectric region, and thereafter depositing a metal within the aperture to form a metal column extending from the pad 106 of microelectronic element 102. Subsequently, a conductive pad 218 can be formed to overlie the dielectric region 216. In a variation thereof, the dielectric layer 178 lining the openings 121, 123 can be omitted because the dielectric region 216 adequately insulates the conductive element 214 from the semiconductor material exposed at the interior surfaces 121, 123 of the openings.

Figure 15:
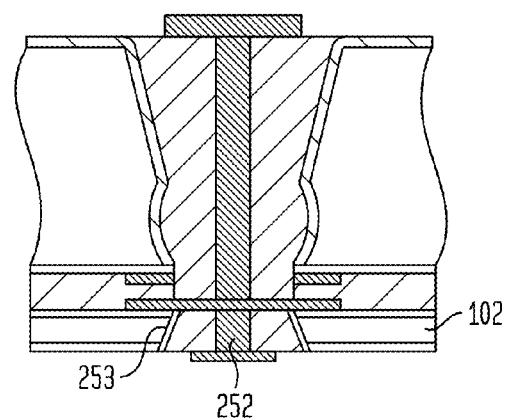
FIG. 15 is a fragmentary sectional view illustrating a microelectronic assembly according to another variation of the embodiment illustrated in FIG. 11.

FIG. 15 illustrates a variation of FIG. 14 which further includes a conductive element 252 extending through an opening 253 in the microelectronic element 102. Like conductive element 214, conductive element 252 does not conform to a contour of an interior surface of the opening 253 within which it extends. It will be appreciated that the conductive elements can have various combinations, in which at least a part of one or more conductive elements conforms to a contour of an interior surface of the opening within which it extends, and does not conform to an interior surface of another part of, or another opening, in a microelectronic element.

Figure 16:
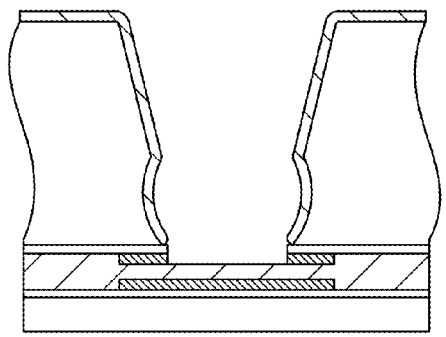
FIGS. 16, 17, 18, and 19 are fragmentary sectional views illustrating stages subsequent to the stage shown in FIG. 6, in a method of fabricating a microelectronic assembly according to a variation of the embodiment of the invention shown in FIGS. 7, 8, 9 and 10.
Figure 17:
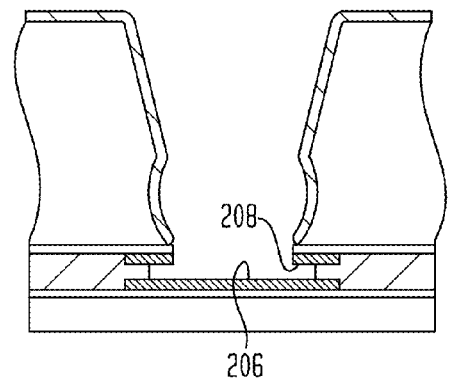
Figure 18:
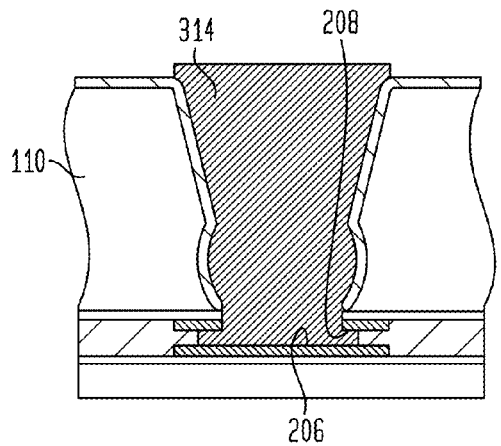
Figure 19:
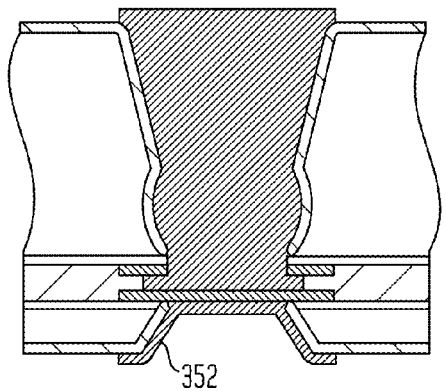

Referring now to FIGS. 16-19, in a further variation, after forming an opening, e.g., a staged opening as illustrated in FIG. 16, a process is applied which removes the material, e.g., bonding material, between juxtaposed surfaces 206, 208 of the conductive pads. For example, an etchant can be used to remove the bonding material from between the juxtaposed surfaces of the pads. Then, as further illustrated in FIG. 18, when forming the conductive element 314, a metal or conductive compound of a metal is deposited in areas between the juxtaposed surfaces 206, 208 of the conductive pads. FIG. 19 further illustrates a structure as seen in FIG. 18, after a further conductive element 352 has been formed. As in the above-described embodiments, the vias extending through microelectronic element 110 can be either single-stage vias or can be multiple-stage vias, as seen, for example, in FIG. 18.

Figure 20:
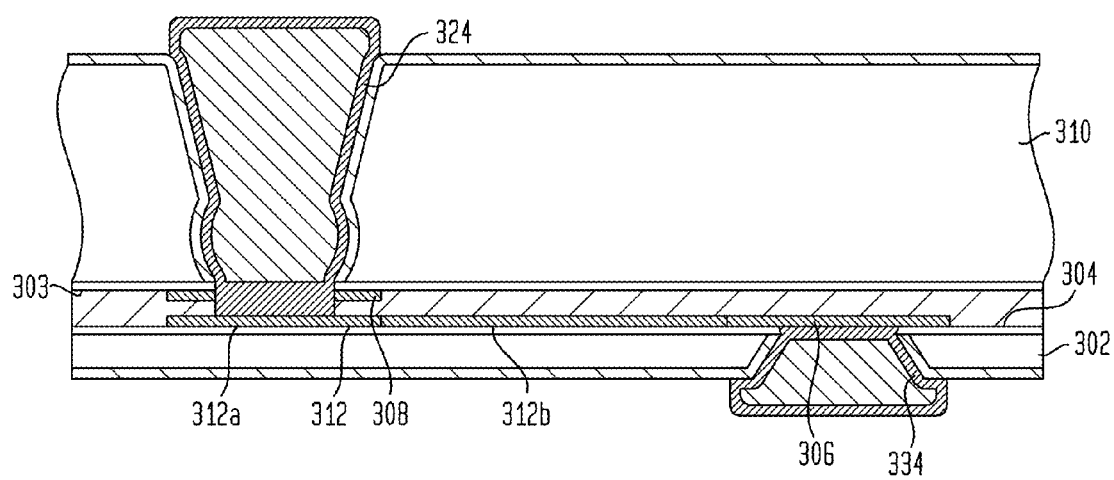
FIG. 20 is a fragmentary sectional view illustrating a microelectronic assembly according to another embodiment of the invention.

FIG. 20 illustrates a further variation in which a conductive pad 306 of a microelectronic element 302 has a conductive element 312 extending away therefrom along the front surface 304 of the microelectronic element 302. For example, the conductive element 312 can include an electrically conductive pad in area 312a and an electrically conductive trace 312b which connects the pad 312a to the pad 306. The conductive element 312 is juxtaposed with a conductive pad 308 of another microelectronic element 310. A second conductive element 324 can extend through an electrically conductive pad 308 at a front surface 303 of the other microelectronic element 310 and be in contact with the conductive element 312. As further seen in FIG. 20, a further electrically conductive element 334 can extend through a thickness of microelectronic element 302 and be in contact with pad 306. Such conductive elements 312, 324, 334 can each be electrically insulated from other conductive features, e.g., pads, other traces, or from the bodies of the microelectronic elements by dielectric layers disposed at the front surfaces 303, 304 and dielectric layers disposed within the openings through which the conductive elements 324, 334 extend.

In a particular embodiment, the conductive element 312 can be applied as a feature of a redistribution layer formed on a wafer during back-end-of-line ("BEOL") processing or subsequent thereto. The arrangement seen in FIG. 20 can be used, for example, in situations in which the location at least one of the conductive pads 306 of a microelectronic element does not match the location of at least one other conductive pad 308 of another microelectronic element. In this way, electrical connections can be made between microelectronic elements 302, 310 without requiring the locations of bond pads on each microelectronic element to match in ways permitting the bond pads to be juxtaposed. In a particular embodiment, one microelectronic element can be a logic chip such as a processor, for example, and another microelectronic element can be a memory chip, i.e., one that has a memory storage element therein. A memory storage element includes a multiplicity of memory cells together with circuitry for reading from and writing to the memory cells.

Figure 21:
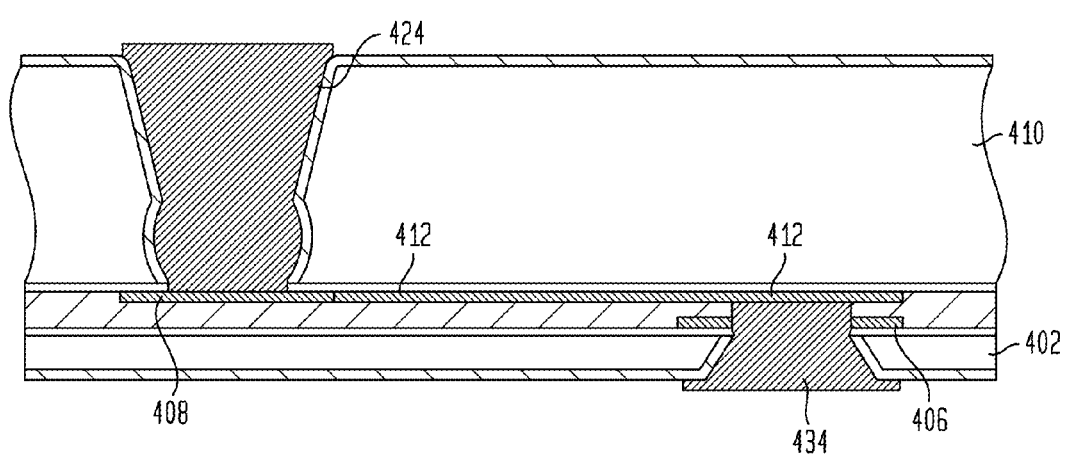
FIG. 21 is a fragmentary sectional view illustrating a microelectronic assembly according to a variation of the embodiment of the invention shown in FIG. 20.

FIG. 21 shows a variation of the embodiment shown in FIG. 20, in which a conductive element 412 extends away from a conductive pad 408 of a microelectronic element 410, such conductive element being juxtaposed with conductive pad 406 of another microelectronic element 402. In this case, a conductive element 434 extends through the conductive pad 406 and is in contact with conductive element 412. FIGS. 20 and 21 illustrate further variations in which any or all of the conductive elements 324, 334, 424, 434 may be hollow as seen in FIG. 20, or non-hollow as seen in FIG. 21.

Figure 22:
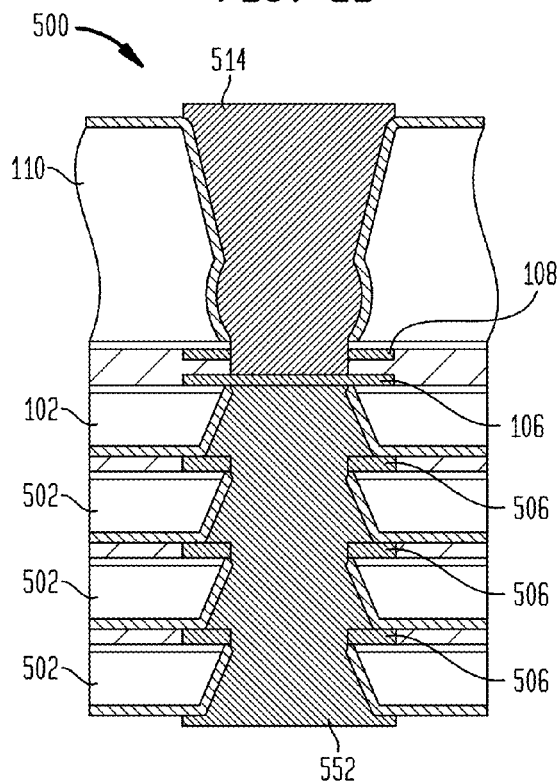
FIG. 22 is a fragmentary sectional view illustrating a microelectronic assembly according to another embodiment of the invention.

FIG. 22 illustrates a further embodiment in which additional microelectronic elements 502 are each stacked and bonded together with microelectronic elements 102, 110 similar to FIG. 1, in an assembly 500 in which conductive elements 552 extending through a thickness of each microelectronic element 502 are electrically connected through openings in pads 506 of each additional microelectronic element 502. In this variation, the conductive element 514 extends through the pad 108.

Figure 23:
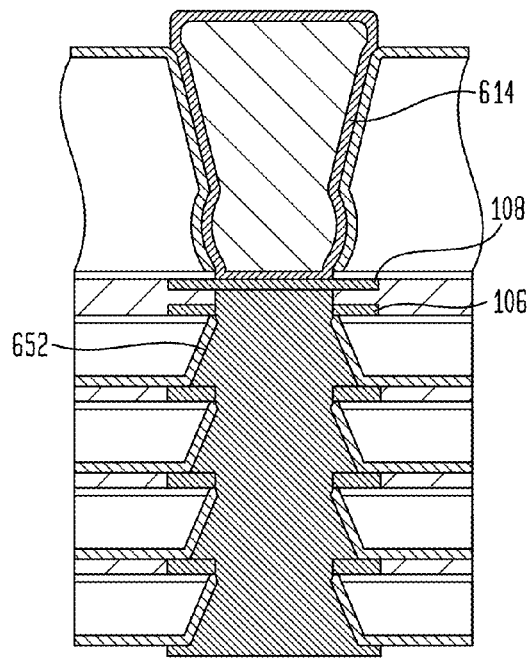
FIG. 23 is a fragmentary sectional view illustrating a microelectronic assembly according to a variation of the embodiment shown in FIG. 22.

FIG. 23 illustrates a variation of such embodiment in which the conductive element 614 is in contact with the pad 108 but another conductive element 652 extends through pad 106 and is in contact with the pad 108. FIG. 23 further shows a variation in which the conductive element 614 is hollow.

Figure 24:
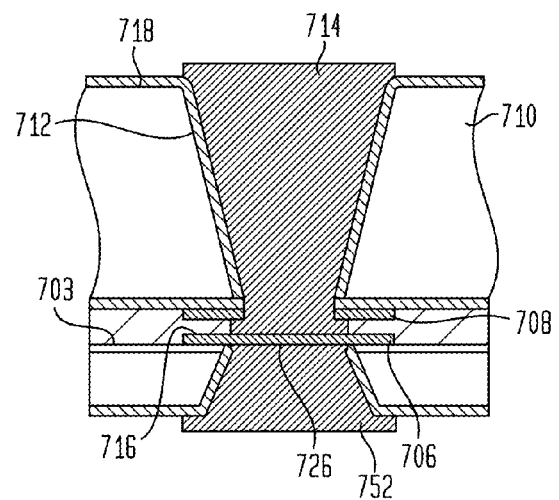
FIG. 24 is a fragmentary sectional view illustrating a microelectronic assembly according to another embodiment of the invention.

FIG. 24 further illustrates a variation in which the opening 712 in microelectronic element 710 is a single-stage opening extending from a rear surface 718 thereof through pad 708 and exposing a portion of the conductive pad 706. Such opening can have a uniform taper between the rear surface 718 and pad 708, as seen in FIG. 24. FIG. 24 illustrates an embodiment in which the conductive element 714 is in contact with an upper surface 716 of the pad 706, and conductive element 752 is in contact with a lower surface 726 of such pad 706.

Figure 25:
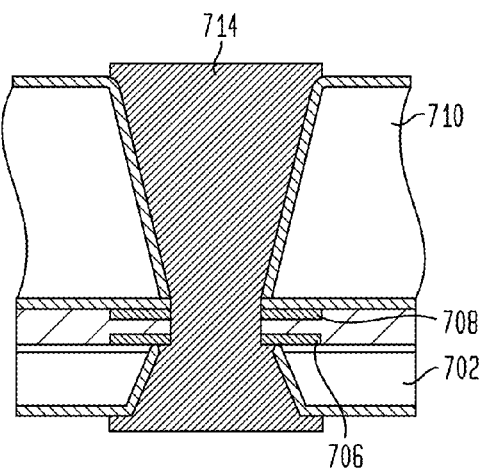
FIG. 25 is a fragmentary sectional view illustrating a microelectronic assembly according to a variation of the embodiment of the invention shown in FIG. 24.

FIG. 25 illustrates a variation of the embodiment of FIG. 24 in which the conductive element 714 extends through openings in both microelectronic elements 710, 702 including through both conductive pads 706, 708.

The structure and fabrication of the microelectronic assemblies and incorporation thereof into higher-level assemblies can include structure, and fabrication steps which are described in one or more of the following commonly owned co-pending applications each filed on Dec. 2, 2010: U.S. Provisional Application No. 61/419,033; and U.S. Nonprovisional application Ser. No. 12/958,866; and the following U.S. applications each filed Jul. 23, 2010: application Ser. Nos. 12/842,717; 12/842,651; 12/842,612; 12/842,669; 12/842,692; and 12/842,587; the disclosures of all such applications being incorporated by reference herein.

Figure 26:
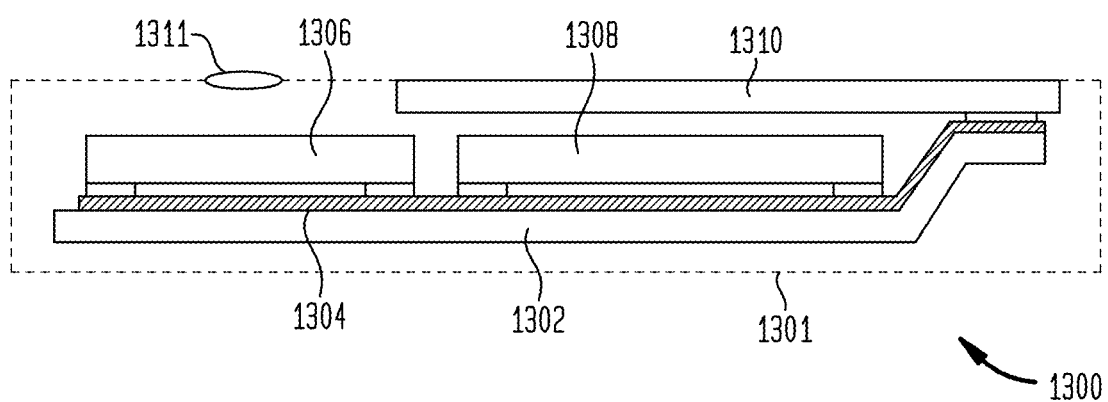
FIG. 26 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 1300 (FIG. 26) in accordance with a further embodiment of the invention includes a structure 1306 as described above in conjunction with other electronic components 1308 and 1310. In the example depicted, component 1308 is a semiconductor chip whereas component 1310 is a display screen, but any other components can be used. Of course, although only two additional components are depicted in FIG. 26 for clarity of illustration, the system may include any number of such components. The structure 1306 as described above may be, for example, a microelectronic assembly 100 as discussed above in connection with FIGS. 1, 2, 4, 20, and 21. In a further variant, both may be provided, and any number of such structures may be used. Structure 1306 and components 1308 and 1310 are mounted in a common housing 1301, schematically depicted in broken lines, and are electrically interconnected with one another as necessary to form the desired circuit. In the exemplary system shown, the system includes a circuit panel 1302 such as a flexible printed circuit board, and the circuit panel includes numerous conductors 1304, of which only one is depicted in FIG. 26, interconnecting the components with one another. However, this is merely exemplary; any suitable structure for making electrical connections can be used. The housing 1301 is depicted as a portable housing of the type usable, for example, in a cellular telephone or personal digital assistant, and screen 1310 is exposed at the surface of the housing. Where structure 1306 includes a light-sensitive element such as an imaging chip, a lens 1311 or other optical device also may be provided for routing light to the structure. Again, the simplified system shown in FIG. 26 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention.

While the above description makes reference to illustrative embodiments for particular applications, it should be understood that the claimed invention is not limited thereto. Those having ordinary skill in the art and access to the teachings provided herein will recognize additional modifications, applications, and embodiments within the scope of the appended claims.

The invention claimed is:

1. A microelectronic assembly, comprising:
a first microelectronic element having a front surface and a first electrically conductive pad exposed at the front surface, and a first electrically conductive element extending along the front surface away therefrom;
a second microelectronic element having a front surface facing the front surface of the first microelectronic element, and a second electrically conductive pad exposed at the front surface and juxtaposed with a portion of the first electrically conductive element, the first and second microelectronic elements embodying active semiconductor devices;
a second electrically conductive element extending within an opening extending from a rear surface of the first microelectronic element towards the front surface thereof, the second electrically conductive element contacting the first electrically conductive pad; and a third electrically conductive element extending within an opening extending from a rear surface of the second microelectronic element towards the front surface thereof, the third conductive element extending through an opening in the second conductive pad and contacting the second electrically conductive pad and the first electrically conductive element, the first electrically conductive element extending in a lateral direction along the front surface of the first microelectronic component from the first electrically conductive pad toward the third electrically conductive element.

2. The microelectronic assembly as claimed in claim 1, wherein the opening in the first microelectronic element includes a first opening extending from a rear surface of the first microelectronic element towards the front surface thereof, and a second opening extending from the first opening towards the front surface of the first microelectronic element, wherein interior surfaces of the first and second openings extend in first and second directions relative to the front surface, respectively, to define a substantial angle, the second electrically conductive element contacting the first electrically conductive pad and electrically connecting the second electrically conductive pad.

3. The microelectronic assembly as claimed in claim 1, wherein the opening in the second microelectronic element includes a first opening extending from a rear surface of the second microelectronic element towards the front surface thereof, and a second opening extending from the first opening towards the front surface of the second microelectronic element, wherein interior surfaces of the first and second openings extend in first and second directions relative to the front surface, respectively, to define a substantial angle, the second electrically conductive element contacting the first electrically conductive pad and electrically connecting the second electrically conductive pad.

4. The microelectronic assembly as claimed in claim 1, wherein the second and third electrically conductive elements are spaced apart from one another in a direction along the front surfaces of the first and second microelectronic elements.

5. The microelectronic assembly as claimed in claim 1, wherein the first electrically conductive element has an upper surface exposed on an adhesive on the front surface of the second microelectronic element and the second electrically conductive element contacts at least a portion of the upper surface.

6. The microelectronic assembly as claimed in claim 1, wherein at least a portion of the first conductive element is an electrically conductive trace.

7. The microelectronic assembly as claimed in claim 1, further comprising a third microelectronic element having a front surface facing the rear surface of the second microelectronic element, and a fourth electrically conductive element extending within an opening extending from the rear surface of the third microelectronic element, the third electrically conductive element extending through an electrically conductive pad of the fourth microelectronic element and contacting the third electrically conductive element.

8. The microelectronic assembly as claimed in claim 7, further comprising one or more fourth microelectronic elements each stacked to overlie the rear surface of the third microelectronic element and being electrically coupled with the third conductive element thereof, each fourth microelectronic element having a front surface facing the rear surface of the third or fourth microelectronic element adjacent thereto, and having a fifth electrically conductive element extending within at least an opening extending from the rear surface of the fourth microelectronic element and extending through the electrically conductive pad of the fourth microelectronic element and contacting the respective electrically conductive element extending through the microelectronic element adjacent thereto.

9. A system comprising a microelectronic assembly as claimed in claim 1 and one or more other electronic components electrically connected to the microelectronic assembly.

10. The system as claimed in claim 9, further comprising a housing, said microelectronic assembly and said other electronic components being mounted to said housing.

* * * * *